US009896780B2

(12) United States Patent
Furuya et al.

(10) Patent No.: US 9,896,780 B2
(45) Date of Patent: Feb. 20, 2018

(54) METHOD FOR PRETREATMENT OF BASE SUBSTRATE AND METHOD FOR MANUFACTURING LAYERED BODY USING PRETREATED BASE SUBSTRATE

(71) Applicant: STANLEY ELECTRIC CO., LTD., Tokyo (JP)

(72) Inventors: Hiroshi Furuya, Shunan (JP); Toshiyuki Obata, Shunan (JP)

(73) Assignee: STANLEY ELECTRIC CO., LTD., Tokyo (JP)

( * ) Notice: Subject to any disclaimer, the term of this patent is extended or adjusted under 35 U.S.C. 154(b) by 92 days.

(21) Appl. No.: 14/905,559

(22) PCT Filed: Jul. 25, 2014

(86) PCT No.: PCT/JP2014/069761
§ 371 (c)(1),
(2) Date: Jan. 15, 2016

(87) PCT Pub. No.: WO2015/012403
PCT Pub. Date: Jan. 29, 2015

(65) Prior Publication Data
US 2016/0168752 A1 Jun. 16, 2016

(30) Foreign Application Priority Data
Jul. 26, 2013 (JP) .................... 2013-155257

(51) Int. Cl.
*C30B 29/38* (2006.01)
*C30B 25/18* (2006.01)
(Continued)

(52) U.S. Cl.
CPC ............ *C30B 25/186* (2013.01); *C30B 25/20* (2013.01); *C30B 29/403* (2013.01);
(Continued)

(58) Field of Classification Search
CPC .......... C30B 29/38; C30B 21/02; C30B 25/04
See application file for complete search history.

(56) References Cited

U.S. PATENT DOCUMENTS 7,632,741 B2   12/2009  Kosaka et al.
7,781,314 B2 *  8/2010  Kyono ................... C30B 25/02
                                                           117/90

(Continued)

FOREIGN PATENT DOCUMENTS

EP   0662526 A1    7/1995
JP   2002-261033 A  9/2002
(Continued)

OTHER PUBLICATIONS

International Search Report dated Oct. 28, 2014; PCT/JP2014/069761.
(Continued)

*Primary Examiner* — Robert M Kunemund
(74) *Attorney, Agent, or Firm* — Ladas & Parry LLP

(57) ABSTRACT

Provided is a method for pretreatment of a group III nitride single crystal substrate having a high Al composition ratio, for manufacturing a high-quality group III nitride thin film. The method includes heating the base substrate at a temperature range of 1000 to 1250° C. for no less than 5 minutes under a first mixed gas atmosphere before a layer of a second group III nitride single crystal is grown, wherein the first mixed gas includes hydrogen gas and nitrogen gas; the base substrate includes a layer of a first group III nitride single crystal at least on a surface of the base substrate; the first group III nitride single crystal is represented by a composition formula of $Al_A Ga_B In_C N$; and the layer of the second group III nitride single crystal is to be grown on the layer of the first group III nitride single crystal.

18 Claims, 4 Drawing Sheets

(51) Int. Cl.
*C30B 25/20* (2006.01)
*C30B 29/40* (2006.01)
*H01L 21/02* (2006.01)

(52) U.S. Cl.
CPC ...... *H01L 21/0242* (2013.01); *H01L 21/0243* (2013.01); *H01L 21/02043* (2013.01); *H01L 21/0254* (2013.01); *H01L 21/0262* (2013.01); *H01L 21/02389* (2013.01); *H01L 21/02598* (2013.01); *H01L 21/02658* (2013.01)

(56) References Cited

U.S. PATENT DOCUMENTS 7,815,970 B2 10/2010 Schlesser et al.
2004/0189184 A1 9/2004 Yasuda

FOREIGN PATENT DOCUMENTS

| JP | 2004-200523 A | 7/2004 |
| JP | 2006-351641 A | 12/2006 |
| JP | 2008-540315 A | 11/2008 |
| JP | 5079361 B2 | 11/2012 |

OTHER PUBLICATIONS

A. Kakanakova-Georgieva, et al; "Epitaxial Growth of AlN Layers on SiC Substrates in a Hot-Wall MOCVD System", © Wiley-VCH Verlag, Berlin, DE, No. 1, Jan. 1, 2002, pp. 205-208, XP002616996, ISSN: 1610-1634.

* cited by examiner

METHOD FOR PRETREATMENT OF BASE SUBSTRATE AND METHOD FOR MANUFACTURING LAYERED BODY USING PRETREATED BASE SUBSTRATE

TECHNICAL FIELD

The present invention relates to a new method for pretreatment of a base substrate having a layer of a first group III nitride single crystal at least on a surface of the base substrate, the layer on which a layer of a second group III nitride single crystal is to be grown. The present invention specifically relates to a method for pretreatment of a base substrate having a layer of a first group III nitride single crystal having a high Al content at least on a surface of the base substrate, which is a new method for heating the base substrate before the layer of the second group III nitride single crystal is grown.

The present invention also relates to a method for manufacturing a layered body in which a layer of a second group III nitride single crystal is layered on a substrate of a first group III nitride single crystal.

BACKGROUND ART

With a group III nitride single crystal including aluminum (Al), which has a direct-transition band structure at an ultraviolet range corresponding to 200 nm to 360 nm of wavelength, ultraviolet light emitting devices having high efficiency can be manufactured.

Group III nitride semiconductor devices are generally made by growing a thin film of a group III nitride single crystal on a single crystal substrate, by a chemical vapor deposition such as Metal Organic Chemical Vapor Deposition (MOCVD), Molecular Beam Epitaxy (MBE), and Halide Vapor Phase Epitaxy (HVPE).

For example, a method of: forming a thin film of a first group III nitride single crystal to be a base substrate on a heterogeneous substrate such as sapphire; and growing a thin film of a second group III nitride single crystal on the base substrate is suggested (see Patent Literature 1). Before the thin film of the second group III nitride single crystal is grown, a pretreatment (thermal cleaning) of the base substrate is normally carried out. Specifically, Patent Literature 1 describes, as this pretreatment method (thermal cleaning), a method for removing an oxide film formed on the surface of the substrate, the method including heating the substrate to a temperature of 1050 to 1100° C. under a hydrogen gas atmosphere, keeping the state for a few minutes, thereafter supplying hydrogen gas and ammonia gas, and keeping the state for a few minutes. It is said that this method makes it possible to form a layer of AlGaN (thin film of second group III nitride single crystal) having a flat surface and a high Al content on a base substrate having a layer of aluminum nitride (AlN) single crystal (thin film of first group III nitride single crystal) on its surface.

CITATION LIST

Patent Literature

Patent Literature 1: JP 5079361 B

SUMMARY OF INVENTION

Technical Problem

However, recently, developments of light emitting devices having much higher performances than conventional devices are hoped. In order to manufacture high-spec light emitting devices, needed is a development of a method for forming a layer smoother than the AlGaN layer described in Patent Literature 1.

Considering the above, an object of the present invention is to provide a method for pretreatment of a group III nitride single crystal substrate having a high Al composition ratio, for manufacturing a high-quality group III nitride thin film.

Solution to Problem

The inventors of the present invention confirmed, with precise researches on conditions of the pretreatment process (thermal cleaning: treatment carried out prior to the growth of a group III nitride single crystal on the AlGaInN layer) of a base substrate having an AlGaInN layer of high Al content on its surface, that the etching of the AlGaInN layer progressed with the base substrate subjected to a high temperature of no less than 1000° C., under an atmosphere of only hydrogen or a mixed gas of hydrogen gas and ammonia gas, which results in degradation of the surface flatness of the layer. The inventors, examining different conditions of the pretreatment, found that the surface flatness of the AlGaInN layer does not degrade when the pretreatment is carried out under a mixed gas atmosphere of hydrogen gas and nitrogen gas. The inventors found that it was possible to form a layer having a good crystallinity, by growing a layer of a group III nitride single crystal on the AlGaInN layer which went through the pretreatment process under the mixed gas atmosphere of hydrogen gas and nitrogen gas. The present invention has been made based on the above findings.

The first aspect of the present invention is a method for pretreatment of a base substrate including the step of: (a) heating the base substrate at a temperature range of 1000 to 1250° C. for no less than 5 minutes under a first mixed gas atmosphere, before a layer of a second group III nitride single crystal is grown, (hereinafter the step may be simply referred to as "pretreatment step" or "thermal cleaning step"), wherein the first mixed gas includes hydrogen gas and nitrogen gas; the base substrate includes a layer of a first group III nitride single crystal (hereinafter the layer may be simply referred to as "first group III nitride single crystal layer") at least on a surface of the base substrate; the first group III nitride single crystal is represented by a composition formula of: $Al_A Ga_B In_C N$ wherein A, B, and C satisfy A+B+C=1.0, 0.5≤A≤1.0, 0≤B≤0.5, and 0≤C≤0.5; and the layer of the second group III nitride single crystal (hereinafter the layer may be simply referred to as "second group III nitride single crystal layer") is to be grown on the layer of the first group III nitride single crystal.

In the first aspect of the present invention, it is preferable that the first mixed gas includes 30 to 95 volume % of hydrogen gas and 5 to 70 volume % of nitrogen gas in a standard state. It is preferable that the first mixed gas does not include ammonia gas. Examples of such a first mixed gas include a form wherein the first mixed gas consists of hydrogen gas and nitrogen gas.

The first aspect of the present invention preferably includes a step of increasing temperature of the base substrate to a temperature at which the heating is carried out and which is no less than 1000° C., under a second mixed gas atmosphere including hydrogen gas and nitrogen gas (hereinafter the step may be simply referred to as "temperature increase step"). This second mixed gas preferably includes 30 to 95 volume % of hydrogen gas and 5 to 70 volume % of nitrogen gas in a standard state as well. Examples of the second mixed gas include a form wherein the second mixed gas consists of hydrogen gas and nitrogen gas.

Further, in a case where the temperature of the heating step and the temperature at which the layer of the second group III nitride single crystal is grown are different from each other, the first aspect of the present invention preferably includes a step of adjusting temperature of the base substrate to a temperature at which the layer of the second group III nitride single crystal is grown (hereinafter the step may be referred to as "preparation step"), wherein the preparation step is carried out after the heating step, under a third mixed gas atmosphere including hydrogen gas and nitrogen gas. This third mixed gas in the preparation step also preferably includes 30 to 95 volume % of hydrogen gas and 5 to 70 volume % of nitrogen gas. It is preferable that the third mixed gas does not include ammonia gas. Examples of the third mixed gas include a form wherein the third mixed gas consists of hydrogen gas and nitrogen gas.

A second aspect of the present invention is a method for manufacturing a layered body including the successive steps of (i) performing pretreatment of the base substrate by the method according to the first aspect of the present invention; and (ii) growing the layer of the second group III nitride single crystal on the layer of the first group III nitride single crystal of the base substrate (hereinafter the step may be referred to as "growing step").

It is preferable that the layer of the second group III nitride single crystal is grown by a metalorganic vapor phase epitaxy method.

Advantageous Effects of Invention

According to the first aspect of the present invention, at the pretreatment step (thermal cleaning) of the base substrate having the first group III nitride single crystal layer at least on its surface, it is possible to inhibit damages of the first group III nitride single crystal layer due to the heating, and sustain a state of flat surface at the atomic level. As a result, it is possible to provide a pretreatment step effective to the growth of the second group III nitride single crystal layer.

According to the second aspect of the present invention, by growing the second group III nitride single crystal layer after the pretreatment step, it is possible to manufacture a layered body of a group III nitride having an improved flatness not only at the atomic level but at the surface in a relatively wide range, and an improved crystallinity.

DESCRIPTION OF EMBODIMENTS

The first aspect of the present invention is a method for pretreatment of a base substrate, the base substrate including a layer of the first group III nitride single crystal at least on a surface of the base substrate, the first group III nitride single crystal layer on which a layer of the second group III nitride single crystal is to be grown. The pretreatment is especially preferably carried out before the second group III nitride single crystal layer having a high Al composition ratio is grown by a chemical vapor deposition.

Figure 1:
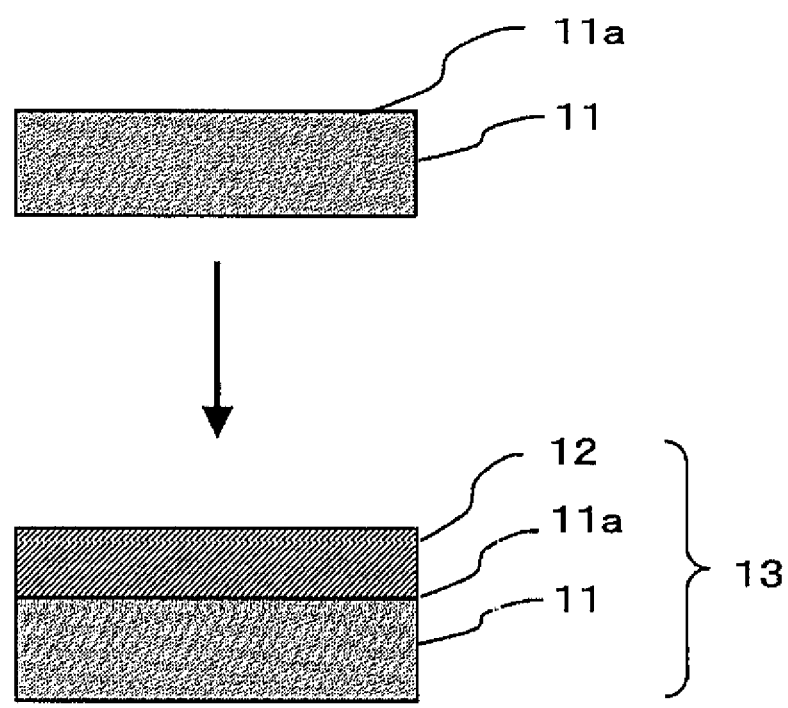
FIG. 1 is a schematic view showing one embodiment of the step of manufacturing a layered body.

More specifically, as shown in FIG. 1, the method includes a heating step (pretreatment step) carried out just before a second group III nitride single crystal layer 12 is grown by a chemical vapor deposition on a base substrate 11 whose outermost surface is a surface 11a of the first group III nitride single crystal layer having a high Al composition ratio. After the pretreatment step, a second group III nitride single crystal layer 12 is formed without a break, to manufacture a layered body 13.

In the present invention, the pretreatment step includes a step of heating the base substrate at a temperature range of 1000 to 1250° C. for no less than 5 minutes under a first mixed gas atmosphere including hydrogen gas and nitrogen gas. Hereinafter the manufacturing methods of the base substrate 11 and the layered body 13 are explained in series.

(Base Substrate 11)

The base substrate used in the present invention includes a layer of a first group III nitride single crystal at least on a surface of the base substrate, and the first group III nitride single crystal is represented by a composition formula of $Al_A Ga_B In_C N$, wherein A, B, and C satisfy $A+B+C=1.0$, $0.5 \le A \le 1.0$, $0 \le B \le 0.5$, and $0 \le C \le 0.5$.

The base substrate can be manufactured by a known method. Examples of the base substrate include a so-called template of a heterogeneous substrate such as a sapphire substrate and an SiC substrate on which the first group III nitride single crystal layer is formed by a chemical vapor deposition. Alternatively, a self-supported substrate of a single layer obtained from the template on which the first group III nitride single crystal layer is thickened and from which the heterogeneous substrate is removed can be used. In addition, not only a first group III nitride single crystal layer formed by a chemical vapor deposition, but also a layer formed by a sublimation method can be used.

The thickness of the base substrate 11 is not particularly limited. In a case where a template is used, it is preferable that the thickness of the heterogeneous substrate is 50 to 500 μm, and the thickness of the first group III nitride single crystal layer is 0.1 to 10 μm, considering operability and productivity. In a case where a self-supported substrate of single layer consisting of the first group III nitride single crystal layer is used, the thickness of the self-supported substrate is preferably 50 to 1000 μm. The diameter of the substrate 11 is not particularly limited either, and normally 1 to 300 mm.

In the present invention, the first group III nitride single crystal layer consisting of a group III nitride single crystal represented by a composition formula of $Al_A Ga_B In_C N$ wherein A, B, and C satisfy $A+B+C=1.0$, $0.5 \le A \le 1.0$, $0 \le B \le 0.5$, and $0 \le C \le 0.5$ is used. That is, the present invention provides an improved effect when the single crystal layer of the surface on which the second group III nitride single crystal layer is to be grown consists of $Al_A Ga_B In_C N$ including no less than 50 mol % of Al. The effect of the present invention is provided more when $0.7 \le A \le 1.0$ and $0 \le B \le 0.3$, and the effect is provided the most when the single crystal layer consists of an AlN single crystal ($A=1.0$, $B=0$, $C=0$).

The surface roughness of the surface of the base substrate, that is, the surface roughness of the first group III nitride single crystal layer on which the layer of the second group III nitride single crystal is to be grown is not particularly limited, and preferably the surface of the first group III nitride single crystal layer on which the layer of the second group III nitride single crystal is to be grown has a root mean square roughness (RMS value) of no more than 5 nm. As is obvious, in a case where a template is used, this surface roughness refers to the surface of the first group III nitride single crystal layer, and in a case where a self-supported substrate of single layer of the first group III nitride single crystal layer is used, the surface roughness refers to the surface on the side where the second group III nitride single crystal layer is to be grown afterward. Hereinafter the surface may be referred to as "the surface of the first group III nitride single crystal layer".

If the surface of the first group III nitride single crystal layer is too rough, the surface of the second group III nitride single crystal layer, which is described in detail below, gets also rough, and the crystallinity degrades, whereby the performance as a device tends to degrade. Therefore, the surface of the first group III nitride single crystal layer further preferably has a root mean square roughness of no more than 1 nm. The lower limit of the RMS value is 0.05 nm, considering industrial production. A known method can be employed for adjusting the surface roughness of the first group III nitride single crystal layer. Specifically, the adjustment can be done by grinding, for example.

The surface orientation at the surface of the first group III nitride single crystal layer is not particularly limited, and preferably the (002) plane (that is, c plane). In addition, in order to obtain a crystal having a higher quality, the first group III nitride single crystal layer preferably has an offset angle (inclination angle of the crystal surface to the surface of the first group III nitride single crystal layer) of approximately 0° to 1°.

The crystallinity of the first group III nitride single crystal layer is not particularly limited. In order to manufacture a layered body (light emitting device) having a higher quality, it is preferable that the value of the full width at half maximum (FWHM) of X-ray rocking curve measured by means of XRD (X-ray diffraction measurement) is small. Specifically, in a case where a template is used, the FWHM of X-ray rocking curve at the (002) plane is preferably no more than 1000 arcsec, further preferably no more than 500 arcsec, and the FWHM of X-ray rocking curve at the (102) plane is preferably no more than 2000 arcsec, further preferably no more than 700 arcsec. In a case where a self-supported substrate of single layer consisting of the first group III nitride single crystal layer is used, the FWHM of X-ray rocking curve at the (002) plane is preferably no more than 300 arcsec, further preferably no more than 100 arcsec, and the FWHM of X-ray rocking curve at the (102) plane is preferably no more than 300 arcsec, further preferably no more than 100 arcsec. The lower limit of the FWHM is 5 arcsec, considering industrial production.

In the present invention, the above-mentioned base substrate is used. The feature of the present invention is that a specific pretreatment step is carried out before the second group III nitride single crystal layer is grown on the base substrate. Other conditions are not particularly limited as long as the specific pretreatment step is carried out, and preferably the temperature increase step described below is carried out prior to the pretreatment step. The temperature increase step will be explained below.

(Temperature Increase Step)

In the present invention, other conditions are not particularly limited as long as the pretreatment step described in detail below is carried out. However, preferably the temperature increase step described below is carried out prior to the pretreatment step.

In a case where the second group III nitride single crystal layer is grown on the base substrate, the base substrate is arranged normally on a predetermined position of a device for growing the second group III nitride single crystal layer, in such a manner that the first group III nitride single crystal layer comes to the outermost surface. At this time, the base substrate is arranged normally at a room temperature. Thereafter, the temperature of the base substrate is increased, and the pretreatment step, preparation step, and growing step, which are described in detail below, are carried out in series.

The temperature increase (temperature increase step) carried out until the temperature of the base substrate reaches a temperature of no less than 1000° C. at which the pretreatment step is carried out is preferably carried out under a second mixed gas atmosphere including hydrogen gas and nitrogen gas, in order to make the surface of the base substrate (the first group III nitride single crystal layer) smoother. The second mixed gas is a mixed gas including hydrogen gas and nitrogen gas. Other gas species included and mixture ratio thereof are not particularly limited.

The second mixed gas preferably includes 30 to 95 volume % of hydrogen gas and 5 to 70 volume % of nitrogen gas in a standard state, further preferably includes 50 to 90 volume % of hydrogen gas and 10 to 50 volume % of nitrogen gas, further preferably includes 60 to 80 volume % of hydrogen gas and 20 to 40 volume % of nitrogen gas. It is noted the second mixed gas may include another gas, within a range where the effect of the present invention is not obstructed.

Considering inhibitions of: heat decomposition of the base substrate; generation of heterogeneous substances; reaction with the base substrate and the like, preferably the second mixed gas does not include ammonia gas. Examples of such a second mixed gas include a form wherein the second mixed gas consists of hydrogen gas and nitrogen gas.

In order to put the base substrate under the second mixed gas atmosphere, hydrogen gas, nitrogen gas, and other gases if necessary, may be supplied in the device where the base substrate is arranged.

The temperature increase rate of the base substrate at the temperature increase step may be adjusted within the range of 20 to 200° C./min for example.

After the temperature of the base substrate arranged in a specific device is increased in the above-described temperature increase step, the pretreatment step is carried out. Next, the pretreatment step will be explained.

(Pretreatment Step)

In the present invention, the base substrate (the first group III nitride single crystal layer) is subjected to a treatment at a specific temperature range and under a specific gas atmosphere, before the second group III nitride single crystal layer is grown.

In specific, the base substrate is heated at a temperature range of 1000 to 1250° C. for no less than 5 minutes under the first mixed gas atmosphere, wherein the first mixed gas includes hydrogen gas and nitrogen gas.

The first mixed gas is a mixed gas including hydrogen gas and nitrogen gas. Other gas species included and the mixture ratio thereof are not particularly limited.

The composition of the first mixed gas is, in a standard state, preferably 30 to 95 volume % of hydrogen gas and 5 to 70 volume % of nitrogen gas, further preferably 50 to 90 volume % of hydrogen gas and 10 to 50 volume % of nitrogen gas, and in view of cleaning effect, especially preferably 60 to 80 volume % of hydrogen gas and 20 to 40 volume % of nitrogen gas. However, the first mixed gas may include another gas, within a range where the effect of the present invention is not obstructed.

In order to obtain the base substrate (the first group III nitride single crystal layer) having a smoother surface, it is preferable that the first mixed gas does not include ammonia gas. Examples of such a first mixed gas include a form wherein the mixed gas consists of hydrogen gas and nitrogen gas.

In order to put the base substrate under the first mixed gas atmosphere at the pretreatment step, hydrogen gas, nitrogen gas, and other gases if necessary, may be supplied in the device.

It is not appropriate, as a treatment condition prior to the crystal growth, that the temperature of the base substrate (the first group III nitride single crystal layer) at the pretreatment step is less than 1000° C. This is because the cleaning effect such as removal of oxides on the surface gets small, even though the damages from etching can be reduced. On the other hand, if the temperature is over 1250° C., the decomposition of the first group III nitride single crystal remarkably progresses, which is not preferable. Therefore, considering both the effect of cleaning and inhibition of decomposition damage, the heating treatment is carried out in the pretreatment step preferably at a temperature range of 1050 to 1240° C. for no less than 5 minutes, more preferably at a temperature range of 1100 to 1230° C. for no less than 5 minutes, especially preferably at a temperature range of 1150 to 1230° C. for no less than 5 minutes.

It is noted that, at the pretreatment step, the temperature of the base substrate may be kept at a fixed temperature in the above temperature range, or varied in the temperature range.

Under the first mixed gas atmosphere, the treatment time to keep the temperature of the base substrate in the above temperature range is no less than 5 minutes. The shorter the treatment time is, the smaller the damages from etching are. However, considering the effect of cleaning, the treatment time must be no less than 5 minutes. Therefore, considering more stable production of the layered body, the treatment time is preferably no less than 7 minutes and especially preferably no less than 10 minutes. Considering the productivity of the layered body, the treatment is sufficiently done normally with the upper limit of the treatment time of no more than 30 minutes, and preferably no more than 20 minutes.

In order to check the effect of the pretreatment step, the temperature of the base substrate is decreased to no more than 700° C., preferably no more than 600° C., kept under the first mixed gas atmosphere. Thereafter, the base substrate is put under a nitrogen gas atmosphere until the temperature of the base substrate decreases to a room temperature. Since the temperature decreases under the same atmosphere as in the pretreatment step, the effect of the pretreatment step can be checked without damaging the first group III nitride single crystal layer.

After the pretreatment step as described above is carried out, the preparation step of adjusting the temperature of the base substrate to a temperature at which the second group III nitride single crystal is grown is carried out. Next, the preparation step will be explained.

(Preparation Step)

After the pretreatment step is completed, the temperature of the base substrate is adjusted to a temperature at which the second group III nitride single crystal layer is grown. At this time, the temperature of the base substrate at the pretreatment step might be changed. In this case as well, the preparation step is preferably carried out under a third mixed gas atmosphere, wherein the third mixed gas includes hydrogen gas and nitrogen gas.

It is noted that, in the pretreatment step under the third mixed gas atmosphere, in a case where the temperature of the base substrate is adjusted to a temperature at which the second group III nitride single crystal layer is grown in a temperature range (e.g. the temperature range of 1000 to 1250° C.) at which the heating treatment described above is carried out, the preparation step is a same step of the pretreatment step. In a case where the second group III nitride single crystal layer is grown at a temperature outside the temperature range at which the heating treatment described above is carried out in the pretreatment step (e.g. at a temperature of less than 1000° C. or over 1250° C.), the second group III nitride single crystal layer is preferably grown under the third mixed gas atmosphere including hydrogen gas and nitrogen gas.

The third mixed gas preferably includes 30 to 95 volume % of hydrogen gas and 5 to 70 volume % of nitrogen gas, further preferably 50 to 90 volume % of hydrogen gas and 10 to 50 volume % of nitrogen gas, especially preferably 60 to 80 volume % of hydrogen gas and 20 to 40 volume % of nitrogen gas, in a standard state. However, the third mixed gas may include another gas, within a range where the effect of the present invention is not obstructed.

It is noted that, considering inhibitions of: thermal decomposition of the base substrate, generation of heterogeneous substances; reaction with the base substrate and the like, it is preferable that the third mixed gas does not include ammonia gas. Examples of such a third mixed gas include a form wherein the third mixed gas consists of hydrogen gas and nitrogen gas.

In order to put the base substrate under the third mixed gas atmosphere at the preparation step, hydrogen gas, nitrogen gas, and other gases if necessary may be provided in the device.

The gas species of the first mixed gas, second mixed gas, and third mixed gas, and the mixture ratios thereof can be same or different. Considering the operability, it is preferable that the first, second, and third mixed gases are mixed gases all having a same composition.

In a case where the temperature of the base substrate is changed from the temperature at the pretreatment step, the temperature increase rate can be adjusted within the range of 10 to 200° C./min, or the temperature decrease rate can be adjusted within the range of 10 to 200° C./min, though not particularly limited. The time for the change may be in the range of 30 to 300 sec.

It is noted that, as described above, the base substrate is preferably under the third mixed gas atmosphere, until the temperature of the base substrate reaches the temperature at which the second group III nitride single crystal layer is grown (hereinafter the temperature may be referred to as growth temperature) from the temperature at which the base substrate is subjected to the pretreatment. Thereafter, it is also possible that the second group III nitride single crystal layer is grown by the supply of raw material gases (group III source raw material gas, group V source raw material gas, and dopant raw material gas supplied if necessary). It is noted that, in order to constantly supply the raw material gases to stably grow the second group III nitride single crystal layer, it is preferable that the desired raw material gases (group III source raw material gas, group V source raw material gas, and dopant raw material gases to be supplied if necessary) are supplied after the base substrate is put under an atmosphere of hydrogen gas only for a relatively short time, for example for 10 seconds to 3 minutes, after the temperature of the base substrate reaches the growth temperature.

In the present invention, it is preferable that the growth temperature of the second group III nitride single crystal layer, when the second group III nitride single crystal layer is grown on the first group III nitride single crystal layer after the pretreatment (the surface of the layer is made smoother), is lower than the above heating temperature at the pretreatment step. Next, the growing step will be explained.

(Growing Step: Method for Manufacturing Layered Body)

As described above, the temperature of the base substrate is adjusted to the growth temperature at the pretreatment step or the preparation step, and the second group III nitride single crystal layer is grown by the supply of a group III source raw material gas, a nitrogen source gas, and if necessary, a dopant raw material gas. In a case where a layered body is manufactured, the growing step is carried out sequentially from the pretreatment step or the preparation step in a same device.

By employing the pretreatment step of the present invention, it is possible to obtain a very good flatness of the surface of the base substrate (first group III nitride single crystal layer). Therefore, the second group III nitride single crystal layer being smooth and having a good crystallinity can be grown, even if a buffer layer, which is normally grown, is not grown. It is noted that, however, a buffer layer may be formed on the base substrate after the pretreatment in the present invention.

In the present invention, the growing step starts from the time point when a group III source raw material gas, nitrogen source gas, and if necessary, a dopant raw material gas are supplied onto the first group III nitride single crystal layer of the base substrate, with the temperature of the base substrate adjusted to the growth temperature at the pretreatment step or the preparation step.

The method for growing the second group III nitride single crystal layer is not particularly limited, and Metal Organic Chemical Vapor Deposition (MOCVD) which can be carried out at a relatively low temperature may be preferably employed. In a case where MOCVD is employed, conditions of growing crystal such as the growth temperature, pressure, kind and flow rate of raw material gases and carrier gases in growing the second group III nitride single crystal layer are not particularly limited, and may be adequately set according to the desired group III nitride single crystal.

Specifically, examples of the group III raw material gas when MOCVD is employed include trimethylaluminum, trymethylgallium, and trimethylindium.

As the nitrogen source gas (group V raw material gas) when MOCVD is employed, ammonia can be given. These raw material gases can be introduced in an MOCVD device by means of hydrogen gas, nitrogen gas and the like as a carrier gas. It is noted that the supply of ammonia preferably starts at the same time of the supply of the group III raw material gas. This is because ammonia severely etches the surface of the first group III nitride single crystal layer.

The supply ratio (V/III ratio) of these raw material gases can be adjusted to grow the second group III nitride single crystal layer having a desired composition. In specific, it is preferable that the second group III nitride single crystal layer consists of a group III nitride single crystal represented by a composition formula of $Al_XGa_YIn_ZN$ wherein X, Y, and Z satisfy $X+Y+Z=1.0$, $0.5 \le X \le 1.0$, $0 \le Y \le 0.5$, and $0 \le Z \le 0.5$. It is especially preferable that $0.6 \le X \le 1.0$, $0 \le Y \le 0.4$, and $0 \le Z \le 0.1$, in a case where the obtained layered body is for deep ultraviolet light emitting devices.

The layer of the second group III nitride single crystal can be multi layered having different compositions. In specific, it is preferable that the layer of the second group III nitride single crystal grown directly on the layer of the first group III nitride single crystal is an n-type group III nitride semiconducting layer. In order to make an n-type group III nitride semiconducting layer, a dopant raw material gas may be supplied having Si such as monosilane and tetraethylsilane, together with a group III raw material gas and nitrogen source gas.

The temperature at which the second group III nitride single crystal layer is grown is not particularly limited, and preferably the layer of the second group III nitride single crystal is grown at a temperature of no less than 1050° C. and less than 1100° C., more preferably 1050 to 1090° C. By growing the layer at the temperature, the layer of the second group III nitride single crystal can have a better crystallinity and smoothness.

When the layered body obtained by the above method is taken out from the device, it is preferable that hydrogen gas and ammonia gas are kept flowed until the temperature decreases to around 800° C., in order to prevent decomposition of the group III nitride single crystal.

By manufacturing a layered body according to the above method, it is possible to obtain a layered body having an improved crystalliniy and surface smoothness. The obtained layered body may be further layered and provided with an electrode, to be a high-quality light emitting device.

EXAMPLES

Hereinafter the present invention will be more explained in detail with reference to Examples and Comparative Examples. However, the present invention is not limited to the examples.

(Preparation of Base Substrate)

The base substrates used in Examples 1 to 3 and Comparative Examples 1 to 8 were prepared by the following method.

A template of the first group III nitride single crystal layer consisting of an aluminum nitride single crystal grown to 1.8 µm, grown on a sapphire substrate by means of an MOCVD device, was used for the base substrates. The manufacture of the template was carried out on a two-inch sapphire base substrate. The obtained template was cleaved in 5 mm×5 mm, and washed in acetone and isopropyl alcohol for 5 minutes each, by an ultrasonic cleaning device. In the following Examples 1 to 3 and Comparative Examples 1 to 8, base substrates cut out from a same template were used. The full width at half maximum of X-ray rocking curve of the AlN (002) plane of the first group III nitride single crystal layer obtained by X-ray diffraction of the manufactured template was 215 arcsec. The RMS (root mean square roughness) of the layer in a range of 2 µM×2 µm obtained from AFM (atomic force microscope) was 0.15 nm.

Example 1

(Temperature Increase Step and Pretreatment Step)

The base substrate was set on a susceptor of an MOCVD device in such a manner that the AlN crystal surface (first group III nitride single crystal layer) came to the outermost surface. Thereafter the pressure in the reactor was reduced to 100 mbar taking 3 minutes, with a flow of a mixed gas of hydrogen gas and nitrogen gas. The mixing ratio of the mixed gas was 76 volume % of hydrogen gas and 24 volume % of nitrogen gas in a standard state. The total flow rate of the mixed gas was 8.5 slm. After the decompression was completed, the temperature in the reactor was increased to 1210° C. taking 8 minutes, at a nearly fixed rate of temperature increase (took 90 seconds from 1000° C. to 1210° C., 65 seconds from 1050° C. to 1210° C., and 45 seconds from 1100° C. to 1210° C.).

Next, the heating treatment of the base substrate was carried out for 10 minutes at a temperature kept at 1210° C. After the heating treatment for 10 minutes was finished, the base substrate was cooled to approximately 600° C. taking 150 seconds under the same mixed gas atmosphere (took 50 seconds from 1210° C. to 1000° C., 40 seconds from 1210° C. to 1050° C., and 30 seconds from 1210° C. to 1100° C.). Thereafter the gas to flow in the reactor was switched to nitrogen gas only. The above mixed gas was flowed until switched to nitrogen gas. After cooled to around the room temperature, the substrate was taken out and subjected to the evaluation described below.

As the evaluation of the base substrate taken out, an evaluation of damages on the surface was carried out by the following method. The base substrate taken out from the device (first group III nitride single crystal layer: AlN single crystal layer surface) was measured in a range of 2 µm×2 µm by an AFM. From the obtained image, atom steps of AlN were observed. The shape of the edge of the steps was not smooth, and asperities due to the etching in the heating treatment were observed. At the 5 points randomly selected from the range of the obtained image, the numbers of asperities in 1 µm range were counted per step, and the average value was defined as the damage density. The obtained damage density is shown in Table 1.

Example 2

The heating treatment was carried out in the same manner as in Example 1, except that the mixing ratio of the mixed gas was 52 volume % of hydrogen gas and 48 volume % of nitrogen gas in a standard state. The surface damage was evaluated. The obtained damage density is shown in Table 1.

Example 3

(Temperature Increase Step and Pretreatment Step)

Figure 2:
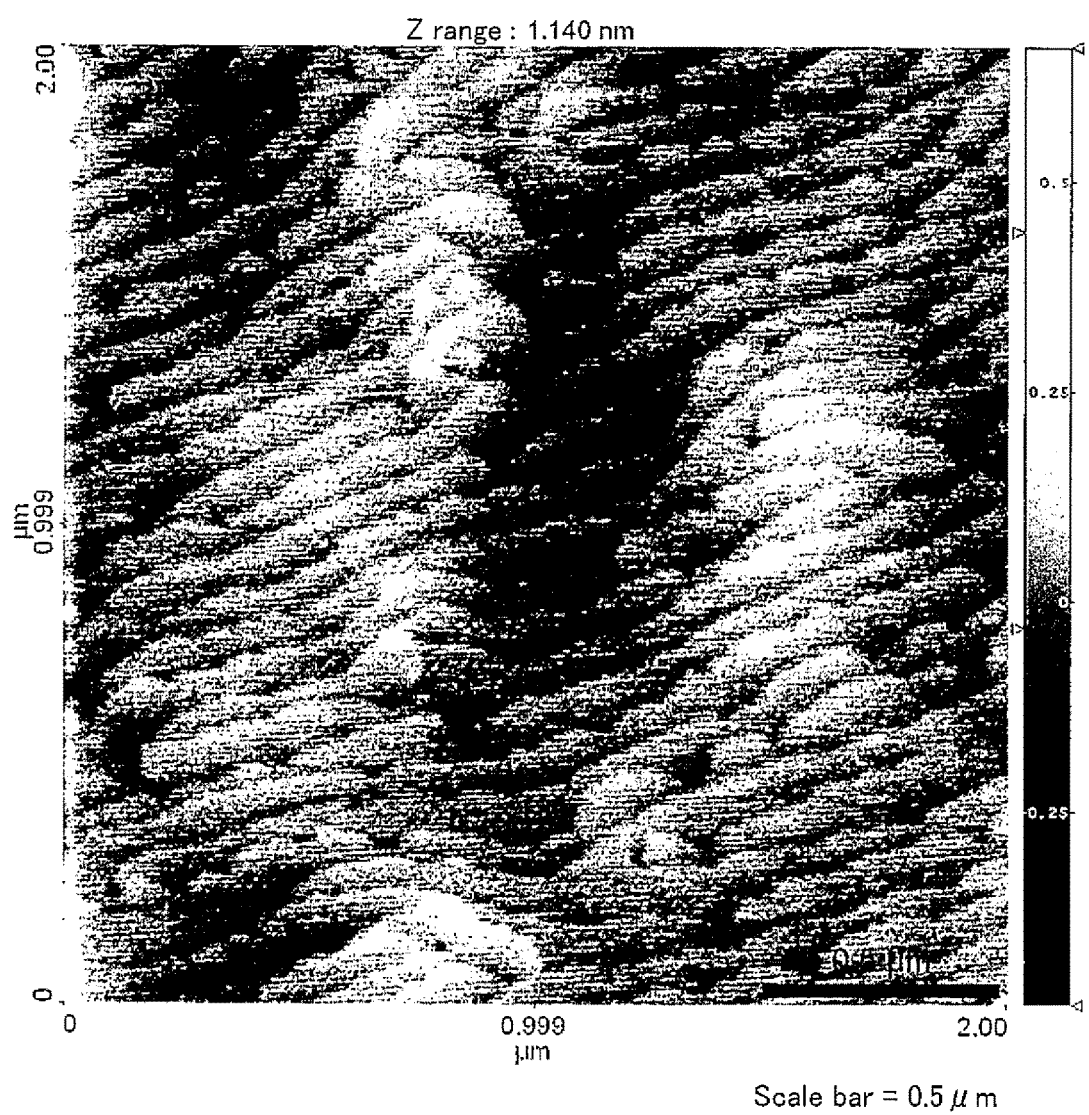
FIG. 2 is a view showing a surface form of the base substrate in Example 3 measured by an AFM (atomic force microscope)

The heating treatment was carried out in the same manner as in Example 1, except that the temperature increase was carried out taking 8 minutes from the room temperature to 1100° C. (took 45 seconds from 1000° C. to 1100° C., and 25 seconds from 1050° C. to 1100° C.) and the substrate was kept heated for 10 minutes at 1100° C. thereafter cooled to 600° C. taking 150 seconds (took 30 seconds from 1100° C. to 1000 and 15 seconds from 1100° C. to 1050° C.). The surface damage was evaluated. The obtained damage density is shown in Table 1. FIG. 2 is a view showing the surface state measured by an AFM.

Comparative Example 1

In this comparative example, a mixed gas of hydrogen gas and ammonia gas was used instead of the mixed gas of hydrogen gas and nitrogen gas.

The base substrate was set in a susceptor of an MOCVD device in such a manner that the AlN crystal surface came to the outermost surface. Thereafter the pressure in the reactor was reduced to 100 mbar taking 3 minutes with a flow of hydrogen gas. The flow rate of the hydrogen gas was 8.5 slm. After the decompression was completed, the temperature in the reactor was increased to 1050° C. taking 8 minutes (took 25 seconds from 1000° C. to 1050° C.). Next, the heating treatment of the base substrate was carried out for 6 minutes at a temperature kept at 1050° C. After the heating treatment for 6 minutes, a flow of ammonia gas was started, and kept at 1050° C. for 5 minutes. The flow rate of the hydrogen gas was 9.0 slm and the flow rate of the ammonia was 800 sccm at the time. After the temperature was kept for 5 minutes, the substrate was cooled to 600° C. taking 150 seconds (took 20 seconds from 1050° C. to 1000° C.), and the gas to flow in the reactor was switched to nitrogen gas only. After cooled to around the room temperature, the substrate was taken out and subjected to the evaluation described in Example 1. The obtained damage density is shown in Table 1.

Comparative Example 2

In this comparative example, the heating treatment was carried out for 10 minutes at 1260° C. under a hydrogen gas atmosphere, thereafter another heating treatment was carried out under a mixed gas atmosphere of hydrogen gas and ammonia gas.

The base substrate was set in a susceptor of an MOCVD device in such a manner that the AlN crystal surface came to the outermost surface. Thereafter the pressure in the reactor was reduced to 100 mbar taking 3 minutes with a flow of hydrogen gas. The flow rate of the hydrogen gas was 8.5 slm. After the decompression was completed, the temperature in the reactor was increased to 1260° C. taking 8 minutes (took 100 seconds from 1000° C. to 1250° C.).

Next, the heating treatment of the substrate was carried out for 10 minutes at a temperature kept at 1260° C. After the heating treatment for 10 minutes, the temperature was decreased to 1200° C. taking 1 minute. After the temperature reached 1200° C., a flow of ammonia gas was started and kept for 5 minutes. The flow rate of the hydrogen gas was 7.7 slm and the flow rate of the ammonia gas was 800 sccm at the time. The temperature was cooled to around 600° C. taking 150 seconds (took 60 second from 1250° C. to 1000° C.), and the gas to flow in the reactor was switched to hydrogen gas only. After the temperature was cooled to around the room temperature, the substrate was taken out and subjected to the evaluation described in Example 1. The obtained damage density is shown in Table 1.

Comparative Example 3

In this comparative example, the heating treatment was carried out at 1260° C. under the atmosphere of hydrogen gas only.

The heating treatment was carried out in the same manner as in Example 1, except that the mixed gas was changed to hydrogen gas only, and the temperature increase from the room temperature to 1260° C. was carried out taking 8 minutes (took 100 second from 1000° C. to 1250° C.) and the temperature was kept at 1260° C. for 10 minutes, thereafter cooled to 600° C. taking 150 seconds (took 60 seconds from 1250° C. to 1000° C.). The surface damage was evaluated. The obtained damage density is shown in Table 1.

Comparative Example 4

In this comparative example, the heating treatment was carried out under the atmosphere of hydrogen gas only.

Figure 3:
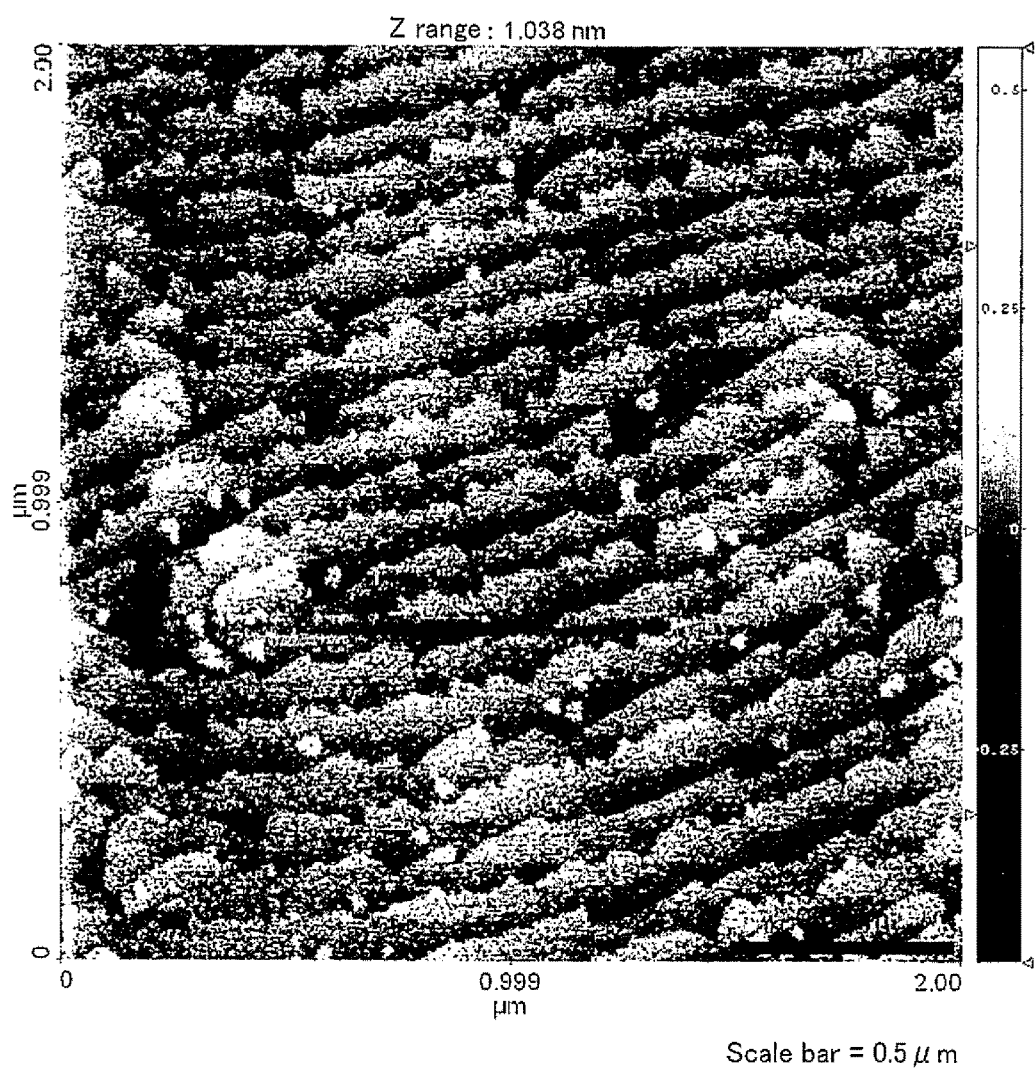
FIG. 3 is a view showing a surface state of the base substrate in Comparative Example 4 measured by an AFM.
Figure 4:
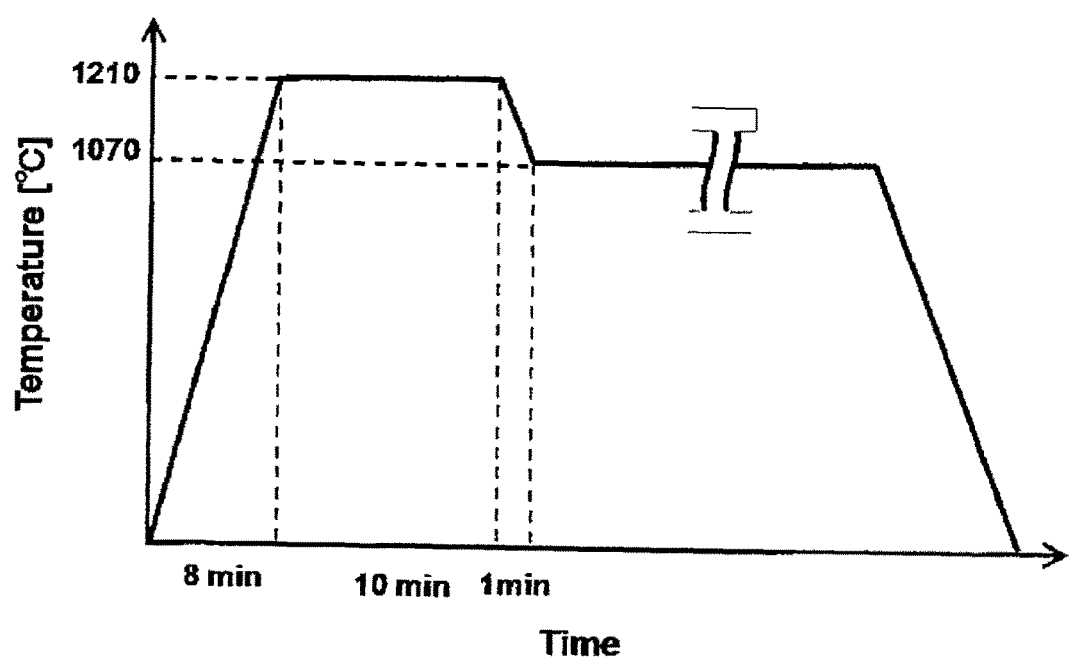
FIG. 4 is a view showing the change over time in the temperature of the base substrate until a layered body is manufactured in Example 4.

The heating treatment was carried out in the same manner as in Example 1, except that the mixed gas was changed to hydrogen gas only, and the surface damage was evaluated. The obtained damage density is shown in Table 1. FIG. 3 is a view showing the surface state measured by an AFM.

Comparative Example 5

In this comparative example, the heating treatment was carried out under the atmosphere of hydrogen gas only.

The heating treatment was carried out in the same manner as in Example 1, except that the mixed gas was changed to hydrogen gas only, and the temperature increase was carried out from the room temperature to 1150° C. taking 8 minutes (took 65 seconds from 1000° C. to 1150° C.) and the temperature was kept at 1150° C. for 10 minutes, thereafter cooled to 600° C. taking 150 seconds (took 45 seconds from 1150° C. to 1000° C.). The surface damage was evaluated. The obtained damage density is shown in Table 1.

Comparative Example 6

In this comparative example, the heating treatment was carried out under the atmosphere of hydrogen gas only.

The heating treatment was carried out in the same manner as in Example 3, except that the mixed gas was changed to hydrogen gas only. The surface damage was evaluated. The obtained damage density is shown in Table 1.

Comparative Example 7

In this comparative example, the temperature of the heating treatment in the pretreatment step was 1260° C., and the treatment time at the temperature of no less than 1000° C. and no more than 1250° C. was 160 seconds in total.

The heating treatment was carried out in the same manner as in Comparative Example 3, except that the mixing ratio of the mixed gas was 76 volume % of hydrogen gas and 24 volume % of nitrogen gas in a standard state. The surface damage was evaluated. The obtained damage density is shown in Table 1.

Comparative Example 8

In this comparative example, the temperature of the heating treatment in the pretreatment step was 1260° C., and the treatment time at the temperature of no less than 1000° C. and no more than 1250° C. was 160 seconds in total.

The heating treatment was carried out in the same manner as in Comparative Example 3, except that the mixing ratio of the mixed gas was 52 volume % of hydrogen gas and 48 volume % of nitrogen gas in a standard state. The surface damage was evaluated. The obtained damage density is shown in Table 1.

TABLE 1

|  | damage density [/µm] |
| --- | --- |
| Example 1 | 4.2 |
| Example 2 | 3.6 |
| Example 3 | 3.8 |
| Comparative Example 1 | 5.8 |
| Comparative Example 2 | 20.2 |
| Comparative Example 3 | 17.0 |
| Comparative Example 4 | 15.4 |
| Comparative Example 5 | 10.6 |
| Comparative Example 6 | 5.2 |

TABLE 1-continued

|  | damage density [/µm] |
| --- | --- |
| Comparative Example 7 | 9.4 |
| Comparative Example 8 | 5.2 |

From Table 1 in which the evaluation results of the surface damage due to the heating treatment of the above Examples 1 to 3 and Comparative Examples 1 to 8 are collected, it is understood that the surface damage decreases as the heating temperature decreases and the ratio of hydrogen gas of the mixed gas decreases.

Example 4

As the base substrate 11, an aluminum nitride single crystal substrate (single layered self-supported substrate) formed in 5 mm×5 mm in size and 560 µm in thickness was used. The full width at half maximum of X-ray rocking curve of the AlN (002) plane of the base substrate obtained by X-ray diffraction was 30 arcsec, and the RMS (root mean square roughness) of the layer in a range of 2 µm×2 µm obtained from an AFM (atomic force microscope) was 0.10 nm. This base substrate was washed in acetone and isopropyl alcohol for 5 minutes each by an ultrasonic cleaning device, thereafter washed with a solution in which phosphoric acid and sulfuric acid were mixed in 1:3 in volume ratio, for 10 minutes, and finally washed with ultra pure water. The acetone, isopropyl alcohol, phosphoric acid, and sulfuric acid were all electronics industrial products manufactured by Wako Pure Chemical Industries, Ltd. The concentration of the phosphoric acid was no less than 85%, and the concentration of sulfuric acid was no less than 96%.

(Temperature Increase Step and Pretreatment Step)

The substrate was set on a susceptor of an MOCVD device in such a manner that the polished surface came to the outermost surface. Thereafter the pressure in the reactor was reduced to 100 mbar taking 3 minutes with a flow of a mixed gas of hydrogen gas and nitrogen gas. The mixing ratio of the mixed gas was 76 volume % of hydrogen gas and 24 volume % of nitrogen gas in a standard state, and the total flow rate of the mixed gas was 8.5 slm. After the decompression was completed, the temperature in the reactor was increased to 1210° C. taking 8 minutes, at a nearly fixed rate of temperature increase (took 90 seconds from 1000° C. to 1210° C., 65 seconds from 1050° C. to 1210° C., and 45 seconds from 1100° C. to 1210° C.). Next, the heating treatment of the substrate was carried out for 10 minutes at a temperature kept at 1210° C.

(Growing Step)

After the heating treatment at 1210° C. for 10 minutes was finished, the temperature in the reactor was changed to 1070° C., and the pressure was changed to 50 mbar, taking 1 minute. Thereafter nitrogen gas was shut out in 1 minute and the gas to flow in the reactor was switched to hydrogen gas only. Thereafter, flow of trimethylaluminum, trimethylgallium, tetraethylsilane, and ammonia into the reactor was started, to grow an n-type $Al_{0.7}Ga_{0.3}N$. The thickness of the grown n-type AlGaN film was approximately 800 nm. The Si concentration in the n-type $Al_{0.7}Ga_{0.3}N$ was around $1.0 \times 10^{19}$ ($cm^{-3}$). After the growth, the temperature was cooled to around 600° C., and the gas to flow in the reactor was switched to nitrogen gas only. After the temperature was cooled to around the room temperature, the substrate was taken out and subjected to an evaluation by the method described below.

The crystallinity of the obtained n-type AlGaN was evaluated with X-ray rocking curve measurement of the (002) plane and (102) plane of the AlGaN by means of X-ray diffraction. The full width at half maximum of the X-ray rocking curve is shown in Table 2.

In an observation of the surface of the obtained n-type AlGaN by a Nomarski differential interference contrast microscope, hillocks originated from screw dislocations were observed. At the 5 points randomly selected in the base substrate, the numbers of the hillocks observed in a range of 640 μm×480 μm were counted, and the value obtained by dividing the average value of the numbers of the hillocks by the area of the observation range was defined as the hillock density. The obtained hillock density is shown in Table 2.

Example 5

An n-type AlGaN was manufactured in the same manner as in Example 4, except that the composition of n-type AlGaN to be grown was changed to n-type $Al_{0.85}Ga_{0.15}N$, and the same evaluation as in Example 4 was carried out. The full width at half maximum of X-ray rocking curve, RMS (in a range of 2 μm×2 μm obtained by an AFM (atomic force microscope)), and hillock density are shown in Table 2.

Comparative Example 9

(Temperature Increase Step and Pretreatment Step)

A base substrate same as that in Example 4 was used. The base substrate was set on a susceptor of an MOCVD device. Thereafter the pressure in the reactor was reduced to 1000 mbar taking 3 minutes, with a flow of hydrogen gas. The flow rate of the hydrogen gas was 8.5 slm. After the decompression was completed, the temperature in the reactor was increased to 1260° C. taking 8 minutes (took 100 seconds from 1000° C. to 1250° C.). Next, the heating treatment of the base substrate was carried out for 10 minutes at a temperature kept at 1260° C. After the heating treatment for 10 minutes at 1260° C., the temperature was decreased to 1200° C. taking 1 minute. After the temperature reached 1200° C., a flow of ammonia gas was started, and kept for 5 minutes. At the time, the flow rate of the hydrogen gas was 7.7 slm, and the flow rate of the ammonia was 800 sccm.

(From the Pretreatment Step Until Before the Growing Step)

After the 5 minutes of keeping at 1200° C., the temperature in the reactor was changed to 1070° C., and the pressure was changed to 50 mbar, taking 1 minute.

(Growing Step)

Thereafter, on the base substrate at 1070° C. as the growth temperature, flow of trimethylaluminum, trimethylgallium, tetraehylsilane, and ammonia into the reactor was started, to grow an n-type $Al_{0.7}Ga_{0.3}N$. The supply amount of the raw material gases, method of taking out the layered body, evaluation and the like were same as in Example 4. The full width at half maximum of X-ray rocking curve, RMS (in a range of 2 nm×2 μm obtained by an AFM (atomic force microscope)), and hillock density are shown in Table 2.

Comparative Example 10

(Temperature Increase Step and Pretreatment Step)

A base substrate same as that in Example 4 was used. The base substrate was set on a susceptor of an MOCVD device. Thereafter the pressure in the reactor was reduced to 100 mbar taking 3 minutes with a flow of hydrogen gas. The flow rate of the hydrogen gas was 8.5 slm. After the decompression was completed, the temperature in the reactor was increased to 1100° C. taking 8 minutes (took 45 seconds from 1000° C. to 1100° C., and 25 seconds from 1050° C. to 1100° C.). Next, the heating treatment of the substrate was carried out for 10 minutes at a temperature kept at 1100° C.

(From the Pretreatment Step Until Before the Growing Step)

After the 5 minutes of keeping at 1200° C., the temperature in the reactor was changed to 1070° C., and the pressure was changed to 50 mbar, taking 1 minute.

(Growing Step)

Thereafter, on the base substrate at 1070° C. as the growth temperature, flow of trimethylaluminum, trimethylgallium, tetraethylsilane, and ammonia into the reactor was started, to grow an n-type $Al_{0.7}Ga_{0.3}N$. The supply amount of the raw material gases, method of taking out the layered body, evaluation and the like were same as in Example 4. The full width at half maximum of X-ray rocking curve, RMS (in a range of 2 nm×2 nm obtained by an AFM (atomic force microscope)), and hillock density are shown in Table 2.

TABLE 2

| | FWHM | | | |
|---|---|---|---|---|
| | (002) plane [arcsec] | (102) plane [arcsec] | RMS [nm] | hillock density [/mm²] |
| Example 4 | 60.6 | 53.6 | 0.14 | 205 |
| Example 5 | 15.9 | 13.5 | 0.12 | 42 |
| Comparative Example 9 | 74.3 | 137.2 | 0.14 | 420 |
| Comparative Example 10 | 182.7 | 105.8 | 0.20 | 381 |

In each of Examples 4 and 5, an n-type AlGaN was grown as the second group III nitride single crystal layer, after the heating treatment same as that in Example 1. In Comparative Example 9, an n-type AlGaN was grown as the second group III nitride single crystal layer, after the heating treatment same as that in Comparative Example 2. In Comparative Example 10, an n-type AlGaN was grown as the second group III nitride single crystal layer, after the heating treatment same as that in Comparative Example 6.

From the full widths at half maximum of X-ray rocking curve of obtained n-type AlGaNs (see Table 2), it is seen that the n-type AlGaNs obtained in Examples 4 and 5 are superior to n-type AlGaNs obtained in Comparative Examples 9 and 10 in crystallinity. The RMSs of Examples 4, 5 and Comparative Examples 9, 10 measured by an AFM were nearly same, which means the n-type AlGaNs were grown having flat surfaces at the atomic level, and it is seen that there are no big differences in the flatness in the minimum range of the surface of the second group III nitride single crystal layer. It is noted, however, that the n-type AlGaNs obtained in Examples 4 and 5 had smaller occurrence rates of hillocks, which means they are superior in flatness in wider ranges.

The n-type AlGaN obtained in Comparative Example 10 had a larger full width at half maximum of X-ray rocking curve and a larger hillock density, than that of Examples 4 and 5. In the heating treatment used in Comparative Example 10, which is same as that in Comparative Example 6, the damage due to the heating treatment was small, as shown in Table 1. However, the crystallinity and flatness of the n-type AlGaN grown after the heating treatment were inferior, which shows that conditions of the heating treatment were so lax that oxide films and impurities of the surface of the substrate was not sufficiently removed.

From the above results, it was shown that a layered body having a higher crystallinity and smoother surface can be manufactured according to the method for manufacturing a layered body of the present invention.

REFERENCE SIGNS LIST 11 base substrate
11a surface of first group III nitride single crystal layer
12 second group III nitride single crystal layer
13 layered body

The invention claimed is:

1. A method for manufacturing an epitaxial layered body, the method comprising the successive steps of:
   (a) preparing a base substrate and arranging the base substrate in an epitaxial growth apparatus, wherein the base substrate comprises a base member and a layer of a first group III nitride single crystal arranged over the base member, the layer of the first group III nitride single crystal being an uppermost layer of the base substrate and having a surface roughness of no more than 5 nm in terms of root mean square roughness; and wherein the first group III nitride single crystal is represented by a composition formula of $Al_AGa_BIn_CN$ satisfying A+B+C=1.0, 0.5≤A≤1.0, 0≤B≤0.5, and 0≤C≤0.5; and wherein a material of the base member is same as or different from the layer of the first group III nitride single crystal; and wherein the base substrate is arranged in the epitaxial growth apparatus in a manner such that the layer of the first group III nitride single crystal comes to an uppermost surface;
   (b) ramping a temperature of the base substrate to a temperature of no less than 1000° C. in a second mixed gas atmosphere in the apparatus, wherein the second mixed gas atmosphere comprises hydrogen gas and nitrogen gas;
   (c) heating the base substrate at a temperature range of 1000 to 1250° C. for no less than 5 minutes in a first mixed gas atmosphere in the apparatus, wherein the first mixed gas atmosphere comprises hydrogen gas and nitrogen gas;
   (d) controlling the temperature of the base substrate at a predetermined growth temperature in a third mixed gas atmosphere in the apparatus, wherein the third mixed gas atmosphere comprises hydrogen gas and nitrogen gas;
   (e) supplying one or more raw material gas for growth selected from a group comprising at least a group III raw material gas, a nitrogen source gas, and a dopant raw material gas, and epitaxially growing a layer of a second group III nitride single crystal by chemical vapor phase epitaxy on the layer of the first group III nitride single crystal without growing a buffer layer, while controlling the temperature of the base substrate at the predetermined growth temperature, in the apparatus,
   wherein the second group III nitride single crystal comprises Al and has an Al composition of 0.7 to 1.0.

2. The method for manufacturing the epitaxial layered body according to claim 1,
   wherein the first mixed gas atmosphere comprises 30 to 95 volume % of hydrogen gas and 5 to 70 volume % of nitrogen gas in a standard state.

3. The method for manufacturing the epitaxial layered body according to claim 1,
   wherein the second mixed gas atmosphere comprises 30 to 95 volume % of hydrogen gas and 5 to 70 volume % of nitrogen gas in the standard state.

4. The method for manufacturing the epitaxial layered body according to claim 1,
   wherein the temperature range of the heating in step (c) does not include the predetermined growth temperature at which the layer of the second group III nitride single crystal is to be grown in step (e).

5. The method for manufacturing the epitaxial layered body according to claim 4,
   wherein the third mixed gas atmosphere comprises 30 to 95 volume % of hydrogen gas and 5 to 70 volume % of nitrogen gas in the standard state.

6. The method for manufacturing the epitaxial layered body according to claim 1,
   wherein the first group III nitride single crystal is an aluminum nitride single crystal.

7. The method for manufacturing the epitaxial layered body according to claim 1,
   wherein the second group III nitride single crystal is grown by a metalorganic vapor phase epitaxy method.

8. The method for manufacturing the epitaxial layered body according to claim 1,
   wherein the layer of the second group III nitride single crystal is grown at a temperature of no less than 1050° C. and less than 1100° C.

9. The method for manufacturing the epitaxial layered body according to claim 4, comprising the successive steps of:
   putting the base substrate under an atmosphere consisting of hydrogen gas for 10 seconds to 3 minutes, after the step (d); and
   supplying raw material gases.

10. The method for manufacturing the epitaxial layered body according to claim 1,
    wherein the second group III nitride single crystal is represented by a composition formula of:

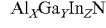

wherein X, Y, and Z satisfy X+Y+Z=1.0, 0.5≤X≤1.0, 0≤Y≤0.5, and Z=0.

11. The method for manufacturing the epitaxial layered body according to claim 1,
    wherein in the step (a), the uppermost surface of the base substrate is an AlN single crystal.

12. The method for manufacturing the epitaxial layered body according to claim 1,
    wherein a value of a full width at half maximum of an X-ray rocking curve measured for (002) plane of the layer of the first group III nitride single crystal is no more than 1000 arcsec in the step (a).

13. The method for manufacturing the epitaxial layered body according to claim 1,
    wherein a value of a full width at half maximum of an X-ray rocking curve measured for (102) plane of the layer of the first group III nitride single crystal is no more than 2000 arcsec in the step (a).

14. The method for manufacturing the epitaxial layered body according to claim 1,
    wherein a value of a full width at half maximum of an X-ray rocking curve measured for (002) plane of the layer of the first group III nitride single crystal is no more than 300 arcsec in the step (a).

15. The method for manufacturing the epitaxial layered body according to claim 1, wherein a value of a full width at half maximum of an X-ray rocking curve measured for (102) plane of the layer of the first group III nitride single crystal is no more than 300 arcsec in the step (a).

16. The method for manufacturing the epitaxial layered body according to claim 1,
wherein the first mixed gas and the second mixed gas have a same mixture ratio.

17. The method for manufacturing the epitaxial layered body according to claim 1,
wherein the first mixed gas and the third mixed gas have a same mixture ratio when the predetermined growth temperature in the step (d) is 1000 to 1250° C.

18. The method for manufacturing the epitaxial layered body according to claim 1,
wherein the first mixed gas and the third mixed gas have different mixture ratio when the predetermined growth temperature in the step (d) is outside a range of 1000 to 1250° C.

* * * * *